(12) United States Patent
Poilasne et al.

(10) Patent No.: US 7,394,430 B2
(45) Date of Patent: *Jul. 1, 2008

(54) WIRELESS DEVICE RECONFIGURABLE RADIATION DESENSITIVITY BRACKET SYSTEMS AND METHODS

(75) Inventors: Gregory Poilasne, San Diego, CA (US); Jorge Fabrega-Sanchez, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 596 days.

This patent is subject to a terminal disclaimer.

(21) Appl. No.: 10/940,702

(22) Filed: Sep. 14, 2004

(65) Prior Publication Data

US 2005/0083234 A1 Apr. 21, 2005

Related U.S. Application Data

(63) Continuation-in-part of application No. 10/775,722, filed on Feb. 9, 2004, now Pat. No. 6,937,195, which is a continuation-in-part of application No. 10/120,603, filed on Apr. 9, 2002, now Pat. No. 6,885,341.

(60) Provisional application No. 60/283,093, filed on Apr. 11, 2001.

(51) Int. Cl.
*H01Q 1/24* (2006.01)

(52) U.S. Cl. .................. 343/702; 373/846

(58) Field of Classification Search .......... 343/702, 343/846, 787, 700 MS, 829
See application file for complete search history.

(56) References Cited

U.S. PATENT DOCUMENTS 3,239,838 A 3/1966 Kelleher
3,413,543 A 11/1968 Schubring et al.
3,573,628 A * 4/1971 Cramer et al. .............. 455/269
3,676,803 A 7/1972 Simmons (Continued)

FOREIGN PATENT DOCUMENTS

DE 40 36 866 A1 7/1991

(Continued)

OTHER PUBLICATIONS

Cuthbert, T., "Broadband Impedance Matching—Fast and Simple", RF Design, Cardiff Publishing Co., vol. 17, No. 12, Nov. 1994, pp. 38, 42, 44, 48, XP000477834.

(Continued)

*Primary Examiner*—Tho G Phan

(57) ABSTRACT

A wireless communications device reconfigurable radiation desensitivity bracket, and associated reconfigurable radiation desensitivity method are provided. The method includes: generating a radiated wave at a first frequency; in response to generating the radiated wave at the first frequency, creating a maximum current per units square (I/units$^2$) through a minimal area of an electrical circuit groundplane; generating a radiated wave at a second frequency; in response to generating the radiated wave at the second frequency, maintaining the maximum I/units$^2$ through the minimal area of the groundplane. Alternately stated, the method controls the distribution of current flow through a groundplane, responsive to radiated emissions, as the wireless device changes operating frequency or communication band. More specifically, the method maintains the maximum I/units$^2$ through the minimal area of the groundplane by coupling the groundplane to a bracket having a selectable effective electrical length.

26 Claims, 14 Drawing Sheets

U.S. PATENT DOCUMENTS

| | | |
|---|---|---|
| 3,678,305 A | 7/1972 | Paige |
| 3,680,135 A | 7/1972 | Boyer |
| 3,737,814 A | 6/1973 | Pond |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,236,125 A | 11/1980 | Bernard et al. |
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,876,552 A * | 10/1989 | Zakman ............... 343/702 |
| 4,908,853 A | 3/1990 | Matsumoto |
| 4,975,604 A | 12/1990 | Barta |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski et al. |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vanatta et al. |
| 5,652,599 A | 7/1997 | Wallace et al. |
| 5,673,188 A | 9/1997 | Lusher et al. |
| 5,701,595 A | 12/1997 | Green, Jr. |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshima et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,889,852 A | 3/1999 | Rosecrans et al. |
| 5,892,486 A | 4/1999 | Cook et al. |
| 5,908,811 A | 6/1999 | Das |
| 5,910,994 A | 6/1999 | Lane et al. |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro |
| 5,977,917 A | 11/1999 | Hirose |
| 5,986,515 A | 11/1999 | Sakurai |
| 5,987,314 A | 11/1999 | Saito |
| 5,990,766 A | 11/1999 | Zhan |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,084,951 A | 7/2000 | Smith et al. |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B2 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,317,083 B1 * | 11/2001 | Johnson et al. ....... 343/700 MS |
| 6,327,463 B1 | 12/2001 | Welland |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,690 B1 | 3/2002 | Tichauer |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,421,016 B1 | 7/2002 | Philips et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B2 | 7/2003 | Gothard et al. |
| 6,653,977 B1 | 11/2003 | Okabe et al. |
| 6,667,723 B2 | 12/2003 | Forrester |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 6,819,203 B2 | 11/2004 | Taniguchi |
| 6,842,086 B1 | 1/2005 | Zennamo et al. |

| | | | |
|---|---|---|---|
| 6,873,294 | B1 | 5/2005 | Anderson et al. |
| 6,898,450 | B2 | 5/2005 | Eden et al. |
| 6,985,113 | B2 | 1/2006 | Nishimura et al. |
| 6,987,486 | B2 | 1/2006 | Kurjenheimo et al. |
| 2001/0026243 | A1 | 10/2001 | Koitsalu et al. |
| 2001/0043159 | A1 | 11/2001 | Masuda et al. |
| 2002/0049064 | A1 | 4/2002 | Banno |
| 2002/0149526 | A1 | 10/2002 | Tran et al. |
| 2002/0149535 | A1 | 10/2002 | Toncich |
| 2002/0175878 | A1 | 11/2002 | Toncich |
| 2003/0062971 | A1 | 4/2003 | Toncich |
| 2003/0134665 | A1 | 7/2003 | Kato et al. |
| 2003/0169206 | A1 | 9/2003 | Egawa |
| 2004/0087280 | A1 | 5/2004 | Watanabe et al. |
| 2004/0162047 | A1 | 8/2004 | Kasahara et al. |
| 2004/0196121 | A1 | 10/2004 | Toncich |
| 2004/0204145 | A1 | 10/2004 | Nagatomo |
| 2004/0207722 | A1 | 10/2004 | Koyama et al. |
| 2004/0263411 | A1 | 12/2004 | Fabrega-Sanchez et al. |
| 2005/0007291 | A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 854 567 | 7/1998 |
| EP | 0 872 953 | 10/1998 |
| EP | 0 881 700 A1 | 12/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 290500-2001133839 | 7/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |
| WO | WO 02/084798 | 10/2002 |
| WO | WO 03/058759 | 7/2003 |

OTHER PUBLICATIONS

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Gevorgian, Spartak S. et al., "HTS/Ferroelectric Devices for Microwave Applications", IEEE Transactions on Applied Superconductivity, Jun. 1997, pp. 2458-2461, IEEE, USA.

Keis, V. N. et al., "20GHz tunable filter based on ferroelectric (BaSr)TiO3 film varactors", Electronics Letters, May 28, 1998, vol. 34, No. 11, IEE Stevenage, GB.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Toncich et al., "Data Reduction Method for Q Measurements of Stripline Resonators", IEEE Transactions in MTT, vol. 40, No. 9, Sep. 1992, pp. 1833-1836.

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

Presser, A., "Varactor-Tunable, High-Q Microwave Filter," RCA Review, vol. 42, Dec. 1981, pp. 691-705.

Chang, C. et al., "Microwave Active Filters Based on Coupled Negative Resistance Method," IEEE Trans. on Microwave Theory & Techs., vol. 38, No. 12, Dec. 1990, pp. 1879-1884.

Katzin, P. et al., "Narrow-band MMIC Filters with Automatic Tuning and Q-Factor Control," 1993 IEEE MTT-S Int. Microwave Symposium Digest, pp. 403-406.

Hopf, B. et al., "Coplanar MMIC Active Bandpass Filters Using Negative Resistance Circuits," 1994 IEEE MTT-S Symposium Digest, pp. 1183-1185.

Karacaoglu, U. et al., "High Selectivity Varactor-Tuned MMIC Bandpass Filter Using Lossless Active Resonators," 1994 IEEE MTT-Symposium Digest, pp. 1191-1194.

Nauta, B., "A CMOS Transconductance-C Filter Technique for Very High Frequencies," IEEE Journal of Solid-State Circuits, vol. 27, No. 2, Feb. 1992, pp. 142-153.

Fujita, K. et al., "A 15.6 GHz Commercially Based 1/8 GaAs Dynnamic Presealer," 1989 IEEE GaAs IC Symposium, pp. 113-116.

Smuk, J. et al., "MMIC Phase Locked L-S Band Oscillators," 1994 IEEE GaAs Symposium Digest, pp. 27-29.

Chandler, S.R. et al., "Active Varactor Tunable Bandpass Filter," IEEE Microwave and Guided Wave Letters, vol. 3, No. 3, Mar. 1993, pp. 70-71.

Hunter, I.C. et al., "Electronically Tunable Microwave Bandpass Filters," IEEE Trans. on MTT, vol. 30, No. 9, Sep. 1982, pp. 1354-1367.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Yu, B., "Variety of Approaches to Designing Microwave Active Filters," Proc. 27th European Microwave Conference, Jerusalem, vol. 1, 1997, pp. 397-408.

Yu, B., "Understand the Operation of Channelized Active Filters," Microwaves & RF, Jan. 1997, pp. 89-92.

Dishal, M., "Alignment and Adjustment of Synchronously Tuned Multiple Resonator-Circuit Filters," Proc. IRE 39, Nov. 1951, pp. 1448-1455.

Cohn, S.B., "Dissipation Loss in Multiple-Coupled-Resonator Filters," Proc. IRE 47, Aug. 1959, pp. 1342-1348.

Matthael, G.L., "An Electronically Tunable Up-Converter," Proc. IRE 49, Nov. 1961, pp. 1703-1704.

Fubini, E.G. et al., "Minimum Insertion Loss Filters," Proc. IRE 47, Jan. 1959, pp. 37-41.

Getsinger, W.J., "Prototypes for Use in Broadbanding Reflection Amplifiers," IEEE Trans. PTGMTT-11, Nov. 1963, pp. 486-497.

Kuh, E.S. et al., "Optimum Sunthesis of Wide-Band Parametric Amplifiers and Converters," IRE Trans. PCCT-8, Dec. 1961, pp. 410-415.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Sleven, R.L., "Design of a Tunable Multi-Cavity Waveguide Band-Pass Filter," 1959 IRE National Convention Record, Part 3, pp. 91-112.

Taub, J.J. et al., "Design of Three-Resonator Dissipative Band-Pass Filters Having Minimum Insertion Loss," Proc. IRE 45, pp. 681-687 (May 1957).

Kotzebue, K.L., "Broadband Electronically-Tunable Microwave Filters," 1960 IRE Wescon Convention Record, Part 1, pp. 21-27.

Louhos, J.P. et al., "Electrical Tuning of Integrated Mobile Phone Antennas," Nokia Mobile Phones, pp. 69-97 (Sep. 15, 1999).

Panayi, P.K. et al., "Tuning Techniques for the Planar Inverted-F Antenna," National Conference on Antennas and Propagation Publication, No. 461, pp. 259-262, (Apr. 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Varadan, V.K. et al., "Design and Development of Electronically Tunable Microstrip Antennas," IOP Publishing Ltd., pp. 238-242, (1999).

Communication Relating to the Results of the Partial International Search: PCT/IB 02/01077 (2002).

Jose et al., "Experimental Investigations on Electronically Tunable Microstrip Antennas," Microwave and Optical Technology Letters, vol. 20, No. 3, pp. 166-169 (Feb. 5, 1999).

International Search Report: PCT/IB 02/01086 (Jun. 24, 2002).
International Search Report: PCT/IB 02/01078 (Jul. 10, 2002).
International Search Report: PCT/IB 02/01087 (Jul. 11, 2002).
International Search Report: PCT/IB 02/01107 (Jul. 11, 2002).
International Search Report: PCT/IB 02/01120 (Jul. 11, 2002).
International Search Report: PCT/IB 02/01098 (Jul. 4, 2002).
International Search Report: PCT/IB 02/01082 (Jul. 8, 2002).
International Search Report: PCT/IB 02/01144 (Jul. 12, 2002).
International Search Report: PCT/IB 02/01026 (Jun. 28, 2002).
International Search Report: PCT/IB 02/01027 (Jun. 25, 2002).

* cited by examiner

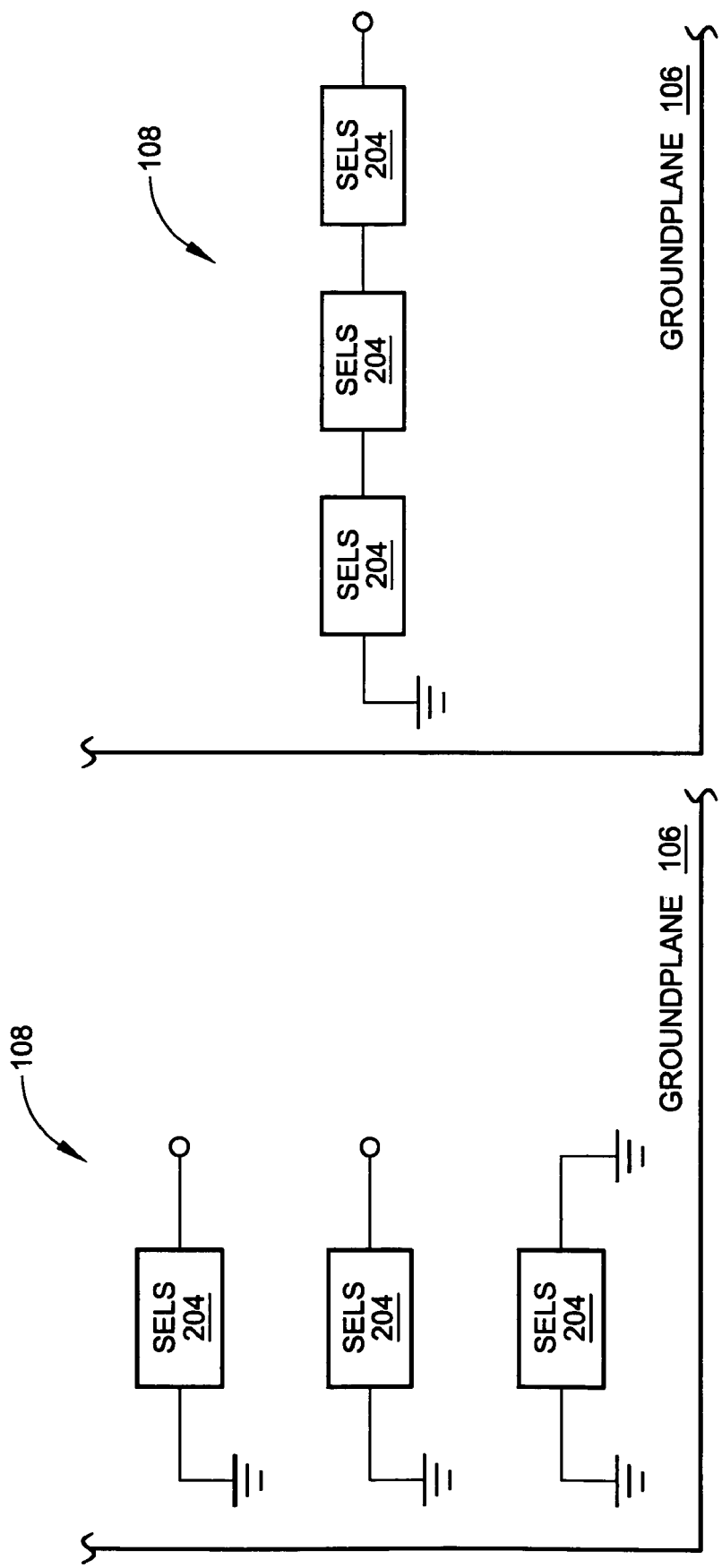

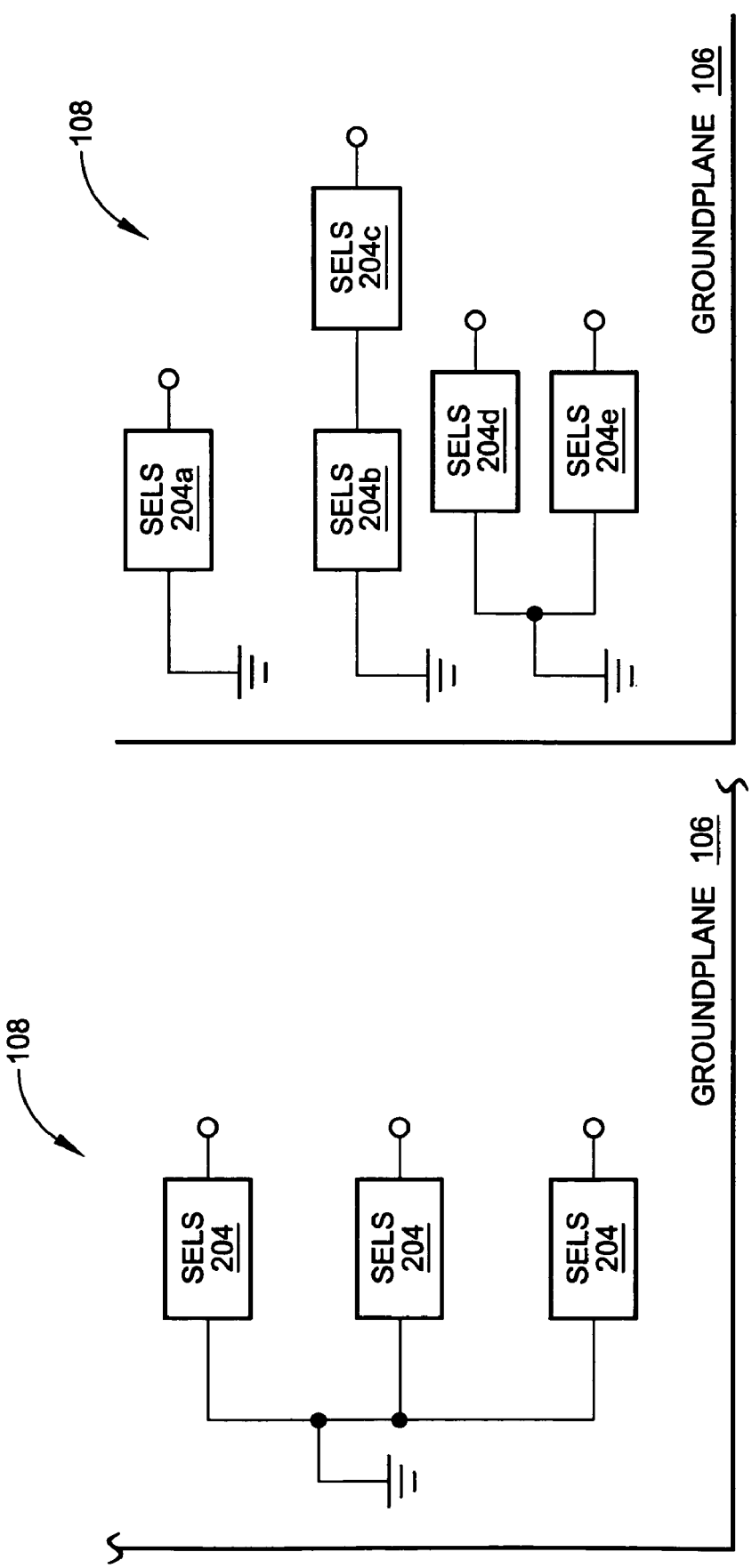

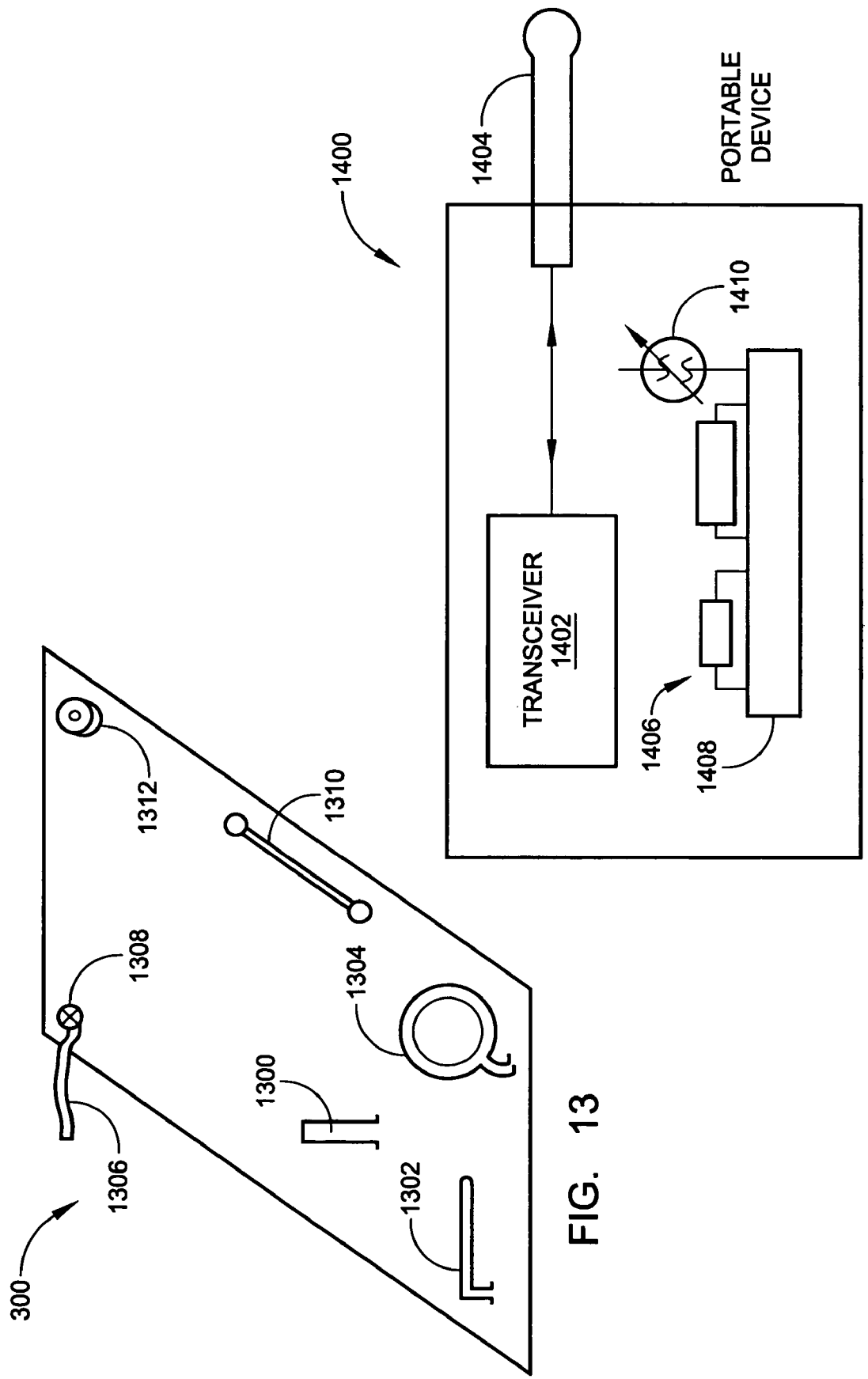

WIRELESS DEVICE RECONFIGURABLE RADIATION DESENSITIVITY BRACKET SYSTEMS AND METHODS

RELATED APPLICATIONS

This application is a continuation-in-part application of U.S. application Ser. No. 10/775,722, filed Feb. 9, 2004, now U.S. Pat. No. 6,937,195 by Jordi Fabrega-Sanchez, Stanley S. Toncich and Allen Tran, which is hereby incorporated by reference. U.S. application Ser. No. 10/775,722 is a continuation-in-part application of U.S. application Ser. No. 10/120,603, filed Apr. 9, 2002, now U.S. Pat. No. 6,885,341 by Jordi Fabrega-Sanchez, Stanley S. Toncich and Allen Tran, which is hereby incorporated by reference, which claims the benefit of U.S. Provisional Application 60/283,093, filed Apr. 11, 2001, which is hereby incorporated by reference.

In addition, this application relates to the following U.S. applications and patents, which are hereby incorporated by reference: "Reconfigurable Radiation Desensitivity Bracket Systems and Methods", filed on the same day and having the same inventors as the present application; U.S. Pat. No. 6,690,176, issued Feb. 10, 2004, by Stanley S. Toncich, entitled "Low Loss Tunable Ferro-Electric Device and Method of Characterization"; U.S. Pat. No. 6,765,540 B2, issued Jul. 20, 2004, by Stanley S. Toncich, entitled "Tunable Antenna Matching Circuit"; application Ser. No. 09/927,136, filed Aug. 10, 2001, by Stanley S. Toncich, entitled "Tunable Matching Circuit"; application Ser. No. 10/076,171, filed Feb. 12, 2002, by Stanley S. Toncich, entitled "Antenna Interface Unit"; and application Ser. No. 10/117,628, filed Apr. 4, 2002, by Stanley S. Toncich and Allen Tran, entitled "Ferroelectric Antenna and Method for Tuning Same".

BACKGROUND OF THE INVENTION

1. Field of the Invention

This invention generally relates to wireless communication and, more particularly, to wireless communication antennas.

2. Description of the Related Art

The size of portable wireless communications devices, such as telephones, continues to shrink, even as more functionality is added. As a result, the designers must increase the performance of components or device subsystems and reduce their size, while packaging these components in inconvenient locations. One such critical component is the wireless communications antenna. This antenna may be connected to a telephone transceiver, for example, or a global positioning system (GPS) receiver.

Wireless communications devices are known to use simple cylindrical coil or whip antennas as either the primary or secondary communication antennas. Inverted-F antennas are also possible. Many conventional wireless telephones use a monopole or single-radiator design with an unbalanced signal feed. This type of design is dependent upon the wireless telephone printed circuit board groundplane or housing or both to act as the counterpoise. A single-radiator design acts to reduce the overall form factor of the antenna. However, the counterpoise is susceptible to changes in the design and location of proximate circuitry, and interaction with proximate objects when in use, e.g., placed on a metallic desk, or the manner in which the telephone is held. As a result of the susceptibility of the counterpoise, the radiation patterns and communications efficiency can be detrimentally impacted. Even if a balanced antenna is used, so that the groundplanes of proximate circuitry are not required as an antenna counterpoise, radiation pattern and radiation-susceptible circuitry issues remain.

This problem is compounded when an antenna, or a group of antennas operate in a plurality of frequency bands. State-of-the-art wireless telephones are expected to operate in a number of different communication bands. In the US, the cellular band (AMPS), at around 850 megahertz (MHz), and the PCS (Personal Communication System) band, at around 1900 MHz, are used. Other communication bands include the PCN (Personal Communication Network) and DCS at approximately 1800 MHz, the GSM system (Groupe Speciale Mobile) at approximately 900 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at 1850 to 2200 MHz.

To dampen the effects of radiation upon proximate circuitry it is known to attach so-called bracket, or radiation-parasitic, elements to a groundplane. Typically, these "brackets" are used to evenly distribute current through the groundplane associated with a radiated wave. Alternately stated, the brackets are used to prevent any particular spot on a circuit board, housing, or keyboard from becoming too sensitive to radiation-induced current. It is difficult, if not impossible, to design a wireless device to minimize the interaction between antenna radiation and susceptible circuitry in every one of its communication bands. As a result, a conventional design must be optimized for one particular communication band, or the design must be compromised to in one or more communication bands of interest.

It would be advantageous if the radiation-induced current sensitivity of a wireless communications device groundplane could be minimized for every frequency of operation.

It would be advantageous if the radiation-induced current sensitivity of a wireless communications device groundplane could be tuned in response to changes in frequency, or in response to one particular groundplane area becoming too sensitive.

It would be advantageous if wireless communication device radiation desensitivity brackets could be made reconfigurable, to minimize the sensitivity of proximate circuitry at every frequency of radiation.

BRIEF DESCRIPTION OF THE DRAWINGS

FIG. 4 is a schematic block diagram of a second variation of the bracket of FIG. 1.

FIG. 5 is a schematic block diagram of a third variation of the bracket of FIG. 1.

FIG. 6 is a schematic block diagram of a fourth variation of the bracket of FIG. 1.

FIG. 7 is a schematic block diagram illustrating a fifth variation of the bracket of FIG. 1.

FIG. 13 is a perspective drawing illustrating some exemplary FELS variations.

FIG. 14 is a schematic block diagram of the present invention portable wireless telephone communications device with a reconfigurable radiation desensitivity bracket.

DETAILED DESCRIPTION

The present invention describes a wireless communications device with a reconfigurable radiation desensitivity bracket that can be added to the groundplane of a circuit proximate to a radiation source such as an antenna, to minimize the effects of radiation-induced current. The bracket can be selectively tuned or switched in response to changes in frequency. Alternately considered, the bracket is space-reconfigurable to selectively redistribute current flow through the groundplane associated with radiated waves.

Accordingly, a method is provided for reconfigurable radiation desensitivity in a wireless communications device. The method comprises: generating a radiated wave at a first frequency; in response to generating the radiated wave at the first frequency, creating a maximum current per units square (I/units$^2$) through a minimal area of an electrical circuit groundplane; generating a radiated wave at a second frequency; in response to generating the radiated wave at the second frequency, maintaining the maximum I/units$^2$ through the minimal area of the groundplane. Alternately stated, the method controls the distribution of current flow through a groundplane, responsive to radiated emissions, as the wireless device changes operating frequency or communication band. The method is applicable to wireless device electrical circuitry such as a printed circuit board (PCB) with mounted components, a display, a connector, or a keypad.

More specifically, the method maintains the maximum I/units$^2$ through the minimal area of the groundplane by coupling the groundplane to a bracket having a selectable effective electrical length. The coupling mechanism may be through a transistor, p/n junction coupling through a PIN diode, selectable capacitive coupling through a varactor diode or ferroelectric capacitor, or mechanically bridging through a switch or microelectromechanical system (MEMS).

Typically, the bracket has a fixed physical length section, in addition to the selectable effective electrical length section to provide a combined effective electrical length responsive to the fixed physical length and the selectable effective electrical length. Further, the bracket may include a plurality of selectable electrical length sections, a plurality of fixed physical length sections, or a plurality of both section types. The sections may be connected to the groundplane, series connected, parallel connected, or combinations of the abovementioned connection configurations.

Figure 1:
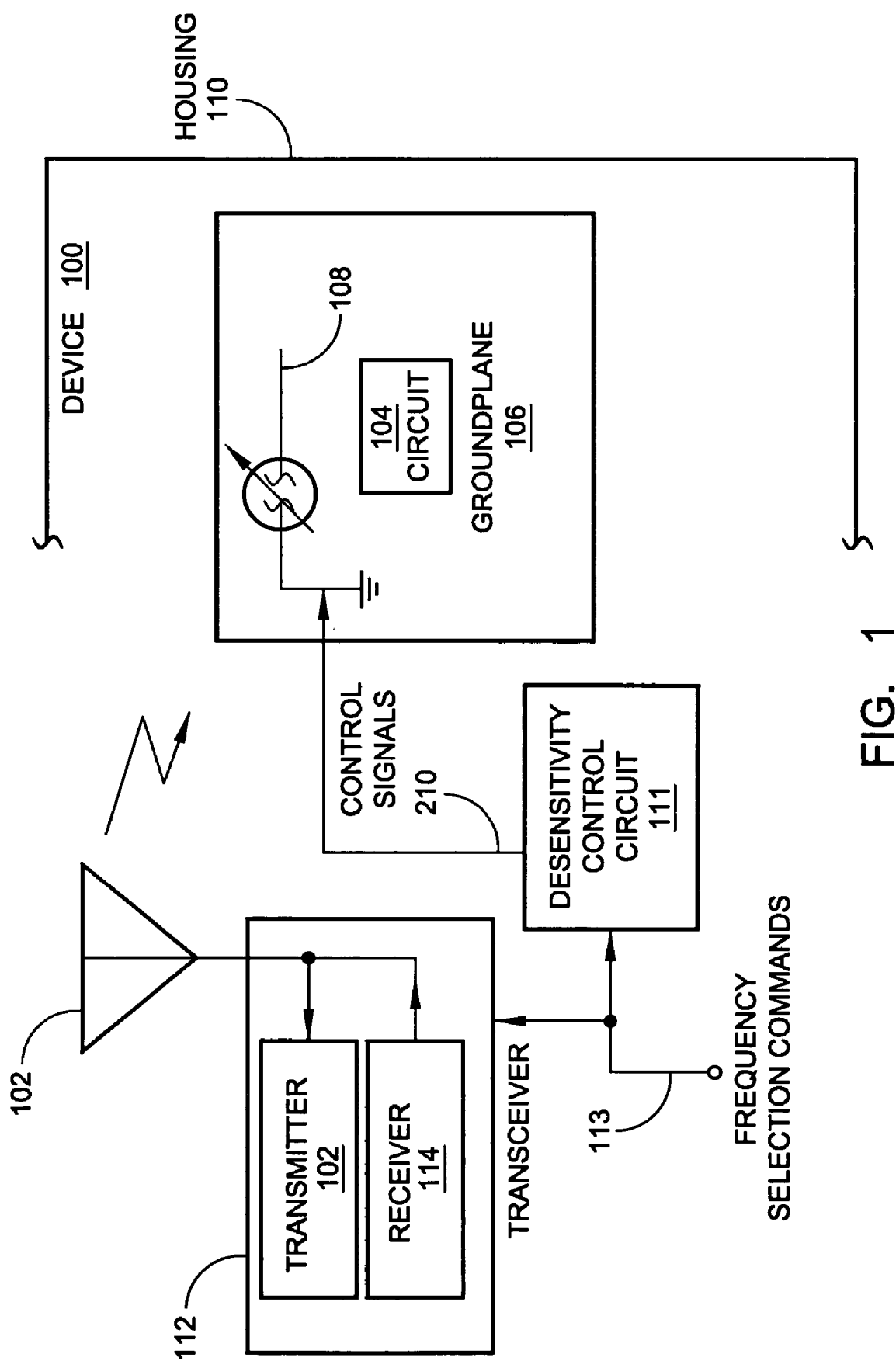
FIG. 1 is a schematic block diagram of the present invention wireless communications device with a reconfigurable radiation desensitivity bracket.

FIG. 1 is a schematic block diagram of the present invention wireless communications device with a reconfigurable radiation desensitivity bracket. The device 100 comprises a transmitter 102 and an antenna 104 connected to the transmitter 102. The wireless device 100 includes an electrical circuit 106 having a groundplane 108. A reconfigurable radiation desensitivity bracket 108 is coupled to the groundplane 106. Examples of the electrical circuit represented by reference designator 104 include components, such as integrated circuits (ICs), transistors, resistors, capacitors, inductors, and the like, mounted on a printed circuit board (PCB). Electrical circuit 104 can also be a display, a connector, or a keypad. The invention is not limited to any particular type of electrical circuit. In some aspects, the groundplane 106 can be the wireless device housing 110. Although the antenna 104 is typically the primary radiation source, the bracket 108 may also be used to control radiation-induced current from a source such as a transistor, resistor, inductor, integrated circuit, or the like (not shown).

Two primary uses of the present invention bracket are for use in a portable or base station wireless communications device, where circuitry is susceptible to radiating elements such as an antenna, transmitter, transmitter component such as a transistor, inductor, resistor, or changes in the environment around a radiating element, to list a few examples. Receiver circuitry, for example, may be susceptible to radiating elements. Another use for the bracket is in microprocessor-driven computing devices, such as a personal computer. Here, susceptible circuitry can be protected, using the present invention bracket, from a radiation source such as a power supply, high-speed ICs, or network interfaces.

One general purpose of the bracket 108 is to evenly distribute groundplane currents that are generated as a result of radiated emissions. For this reason, the bracket 108 is termed a radiation desensitivity bracket, as radiation-generated current flow through a groundplane often makes wireless device transceiver and antenna circuitry susceptible to proximate objects that interrupt and modify current flow patterns. That is, the bracket acts to distribute current flow so as make the groundplane less susceptible to proximate objects. In other aspects, the bracket can be used to intentionally direct radiation-induced current flow to particular areas of the groundplane, for example, to a shielded area of the groundplane that is not susceptible to proximate objects such as a user's hand or to a wall that may temporarily be in close proximity (within the near-field).

Figure 2:
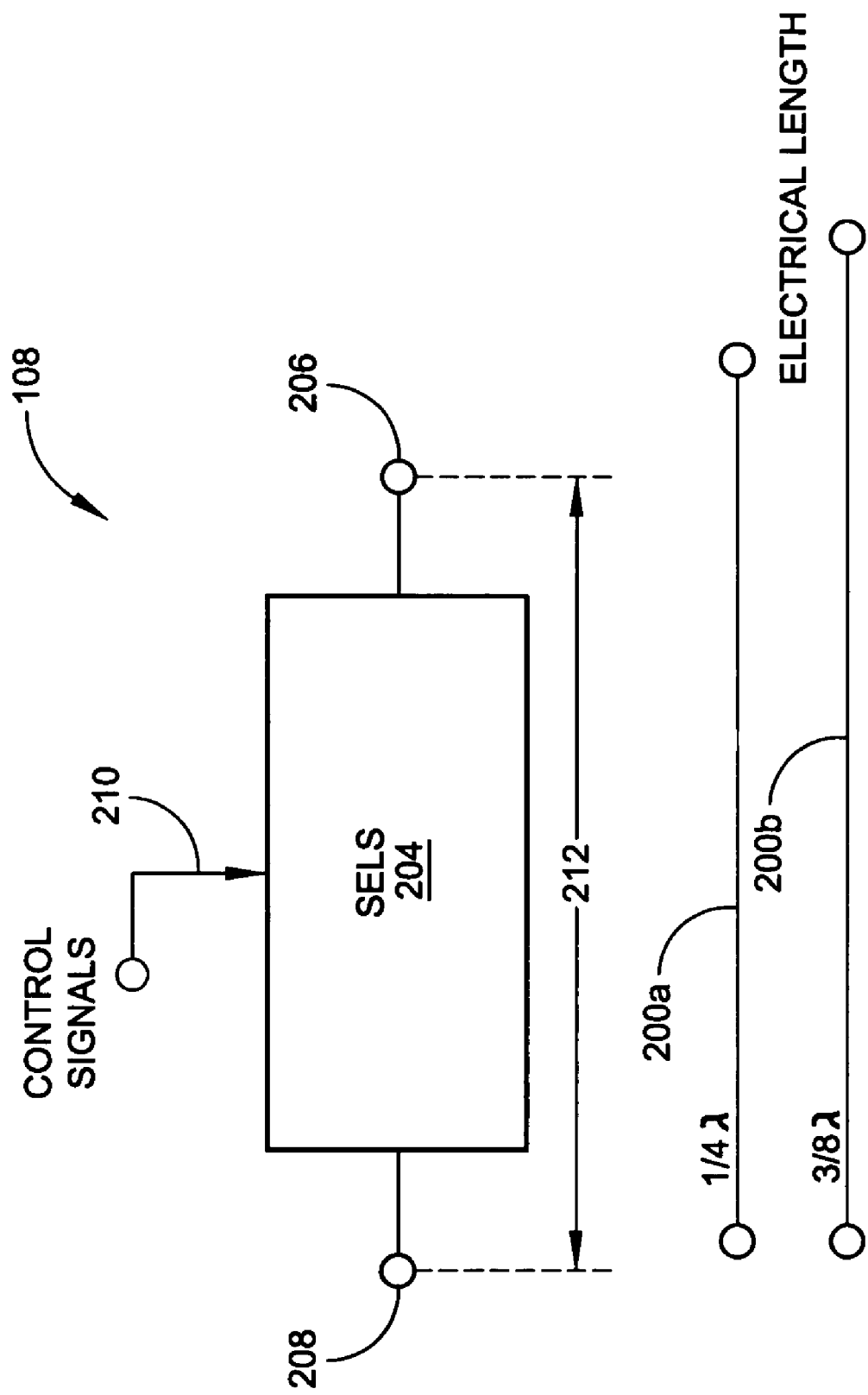
FIG. 2 is a schematic block diagram of the bracket of FIG. 1.

FIG. 2 is a schematic block diagram of the bracket 108 of FIG. 1. Generally, the bracket 108 has a selectable effective electrical length 200. The electrical length 200 is the measurement of wavelength, or wavelength portion. The electrical length is directly proportional to frequency, and is modified by the dielectric constant of the material through which the radiated wave travels to reach the bracket 108. For example, the bracket may be tuned to have either an electrical length 200a or electrical length 200b. As can be appreciated by those skilled in the art, the bracket, in combination with the attached groundplane, forms parasitic element that has a radiation susceptance or sensitivity that is dependent upon the frequency of radiation. That is, the interaction of a radiated wave with the groundplane/bracket combination is dependent upon the electrical length of the bracket. Every bracket 108 includes a selectable electrical length section 204 having a distal end 206, a proximal end 208, a control input on line 210 to accept control signals, and a selectable effective electrical length 200 responsive to the control signals on line 210. The bracket is termed configurable in that it may include switch elements, tunable elements, or both. As explained in detail below, the electrical length of the bracket can be manipulated using either the switchable or tunable elements.

The selectable electrical length section (SELS) 204 can be a coupling element such as FET, bipolar transistor, PIN diode, ferroelectric capacitor, varactor diode, or microelectromechanical system (MEMS) switch. The electric length of the SELS 204 is dependent upon more than just the physical length 212 of the section. That is, the coupling action of the SELS 204 includes a reactance or imaginary impedance component that can be varied to change the electrical length. Note, a MEMS switch can be used a variable air-gap capacitor by partially closing the switch.

Returning to FIG. 1, a desensitivity control circuit 111 has an input on line 113 to accept frequency selection commands and an output on line 210, connected to the selectable effective length section 204. The desensitivity control circuit 111 supplies control signals in response to the frequency selection commands. That is, the desensitivity control circuit 111 tracks the frequency selection commands sent to the transceiver 112 on line 113 and provides control signals to the bracket accordingly.

In one aspect, the transmitter 102 is a wireless telephone transmitter, part of transceiver 112 that additionally includes a receiver 114. As noted above, the transmitter (and receiver 114), or a set of transceivers 112 (not shown), may operate in a number of different communications bands, such as AMPS or PCS to name just a couple of examples. Further, the transmitter 102 may operate in number of channels within a particular communication band. Advantageously, the bracket 108 can be configured for every frequency of operation.

For example, the transmitter 102 may selectively operate at a first frequency and a second frequency. Then, the bracket 108 selectable electrical length section has a first effective electrical length, selected in response to the transmitter operating at the first frequency. The first effective electrical length may operate to evenly distribute radiation-induced ground current when the transmitter 102 operates at the first frequency. Likewise, the bracket 108 SELS has a second effective electrical length, selected in response to the transmitter 102 operating at the second frequency. The second effective electrical length may operate to evenly distribute radiation-induced current in the groundplane when the transmitter operates at the second frequency.

Figure 3:
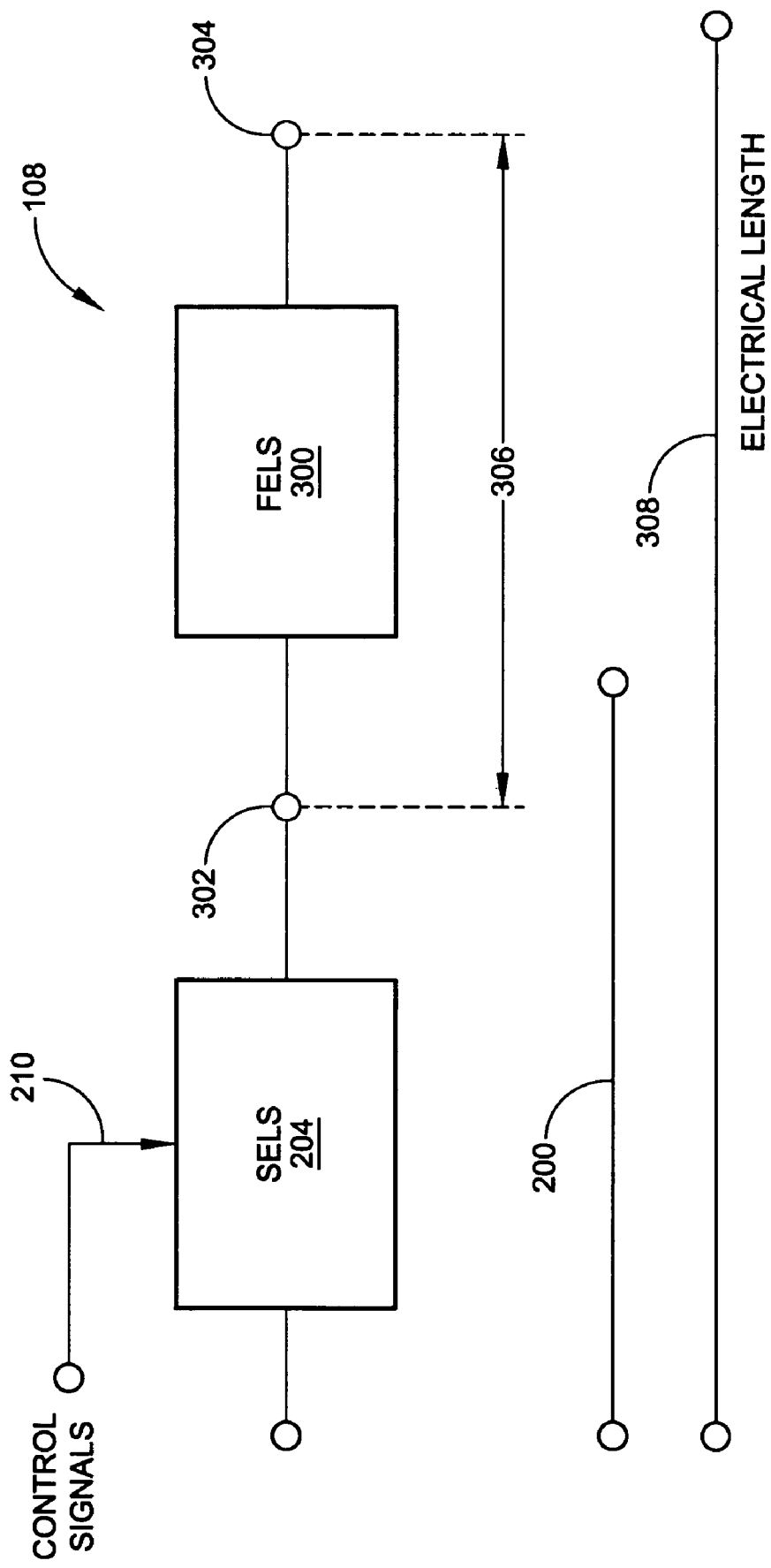
FIG. 3 is a schematic block diagram of a first variation of the bracket of FIG. 1.

FIG. 3 is a schematic block diagram of a first variation of the bracket 108 of FIG. 1. In this variation, the bracket 108 further includes a fixed electrical length section (FELS) 300 having a distal end 302, a proximal end 304, and a fixed physical length 306. The combination of the selectable electrical length section 204 and the fixed electrical length section 300 provides a combined selectable effective electrical length 308 responsive to the control signal on line 210. That is, the overall electrical length 308 is a combination of the physical length 306 of the FELS 300 and the electrical length 200 of the SELS 204, which may be physical length, if enabled as a MEMS for example, or a reactance, if enabled as a varactor diode for example.

FIG. 4 is a schematic block diagram of a second variation of the bracket 108 of FIG. 1. The bracket 108 may include a plurality of selectable electrical length sections 204. Although three SELS' 204 are shown, the invention is not limited to any particular number. As shown, the SELS' 204 are connected to the groundplane 106.

FIG. 5 is a schematic block diagram of a third variation of the bracket 108 of FIG. 1. As shown, the three SELS' 204 are series-connected to the groundplane 106. Note, although the series of SELS' is shown as open-connected (unterminated), in other aspects both ends of the bracket 108 may be connected to the groundplane 106 or other circuitry (not shown). In other shown aspects not shown, the connections between individual SELS' 204 in the series may be terminated in the groundplane 106.

FIG. 6 is a schematic block diagram of a fourth variation of the bracket 108 of FIG. 1. As shown, the three SELS' 204 are parallel-connected to the groundplane 106. In other aspects not shown, both ends of one or all the SELS' 204 may be terminated in the groundplane.

FIG. 7 is a schematic block diagram illustrating a fifth variation of the bracket 108 of FIG. 1. Here, SELS 204*a* is connected to the groundplane 106, SELS' 204*b* and 204*c* are series-connected to the groundplane 106, and SELS' 204*d* and 204*e* are parallel-connected to the groundplane 106. Note, although each configuration of SELS' 204 is shown as open-connected (unterminated), in other aspects both ends of each configuration may be connected to the groundplane 106 or other circuitry (not shown).

Figure 8:
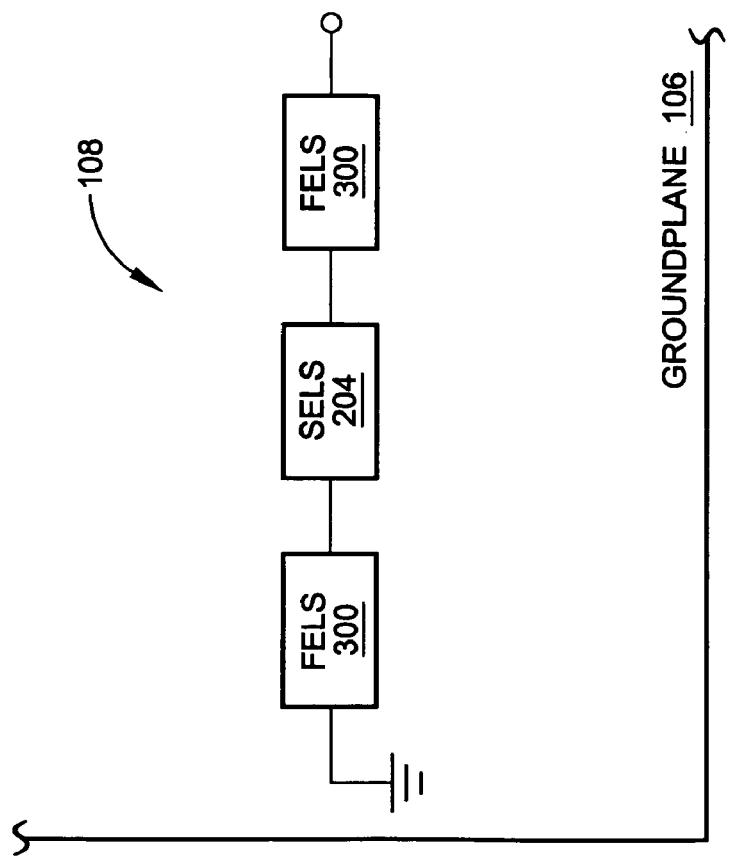
FIG. 8 is a schematic block diagram of a sixth variation of the bracket of FIG. 1.

FIG. 8 is a schematic block diagram of a sixth variation of the bracket 108 of FIG. 1. In this aspect, the bracket 108 includes a plurality of fixed electrical length sections 300. As shown, two FELS' 300 are series-connected through an intervening SELS 204. Note, although the series of sections is shown as open-connected (unterminated), in other aspects both ends of the bracket may be connected to the groundplane 106 or other circuitry (not shown), or the connections between sections may be terminated in the groundplane 106.

Figure 9:
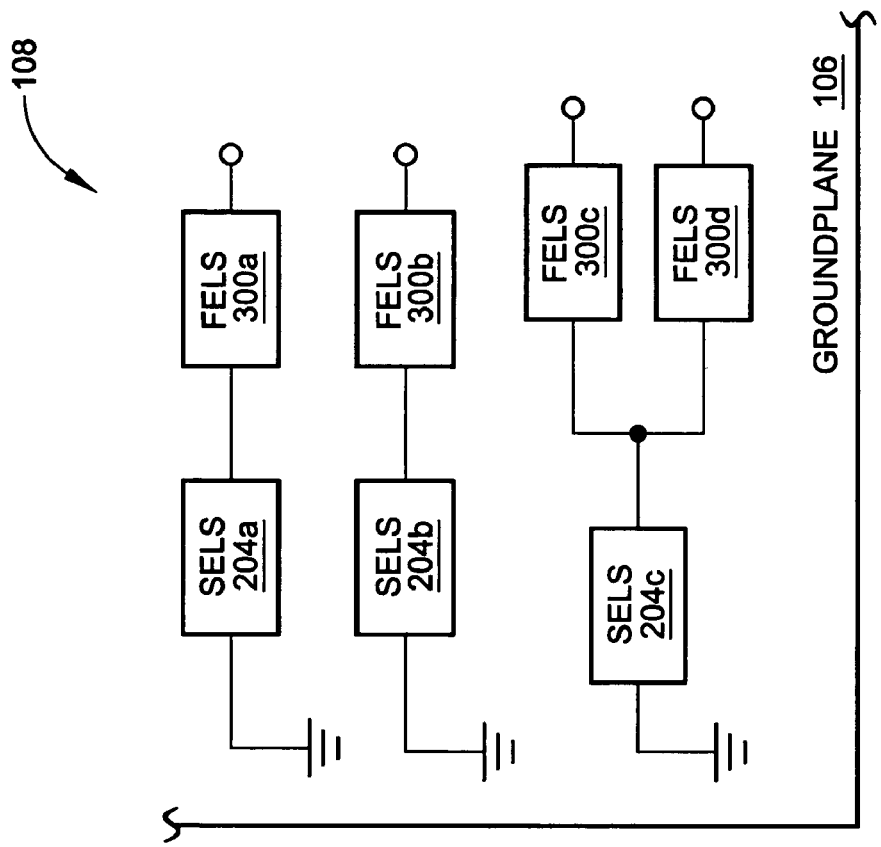
FIG. 9 is a schematic block diagram illustrating a seventh variation of the bracket of FIG. 1.

FIG. 9 is a schematic block diagram illustrating a seventh variation of the bracket 108 of FIG. 1. As shown, FELS 300*a* and 300*b* are parallel-connected to the groundplane 106 through separate SELS' 204*a* and 204*b*, respectively. Alternately, FELS' 300*c* and 300*d* are parallel-connected through a single SELS 204*c*. Note, although each configuration of sections is shown as open-connected (unterminated), in other aspects both ends of each configuration may be connected to the groundplane 106 or other circuitry (not shown).

Figure 10:
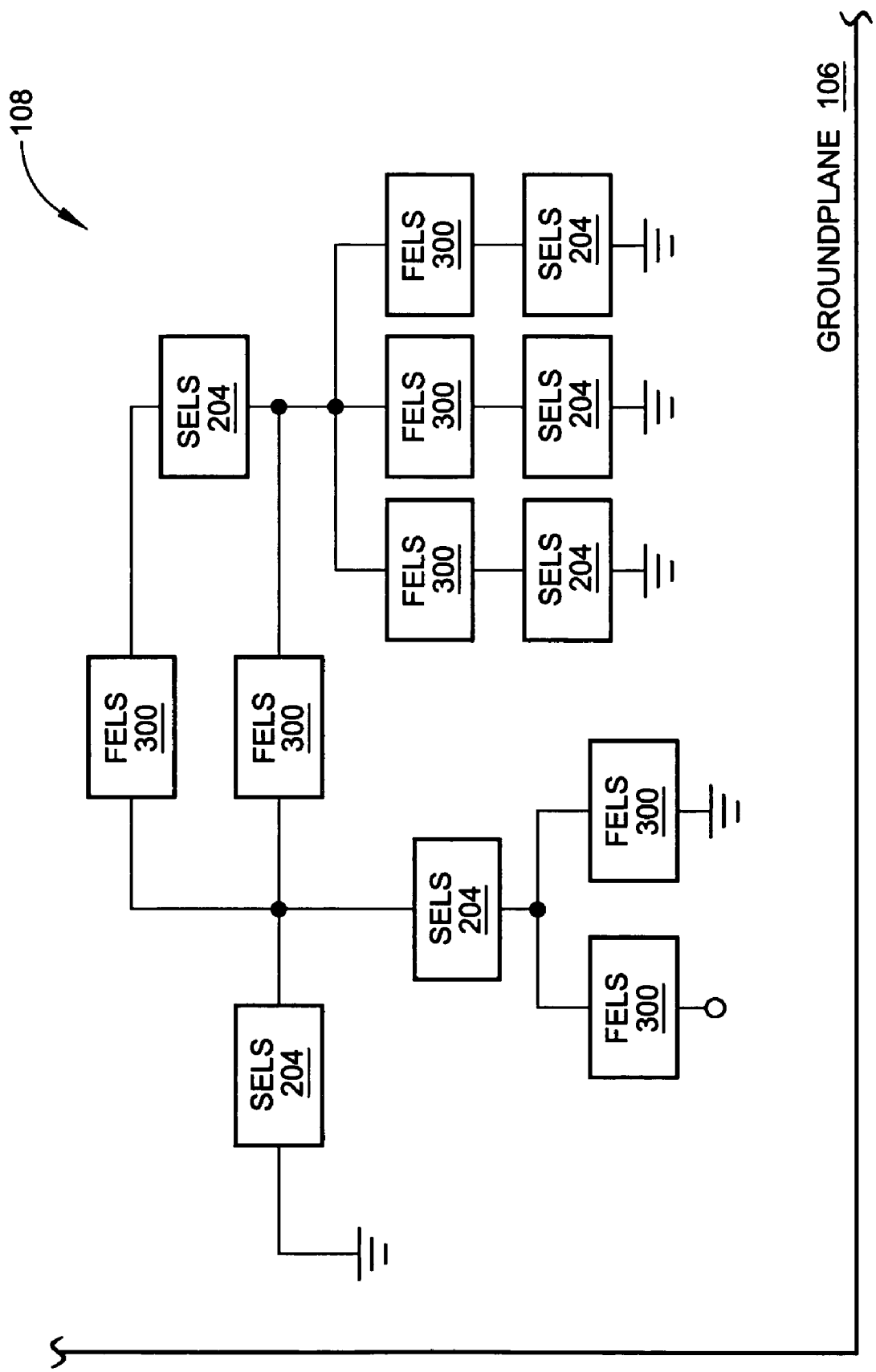
FIG. 10 is a schematic diagram illustration some combinations of series-connected and parallel-connected FELS.

FIG. 10 is a schematic diagram illustration some combinations of series-connected and parallel-connected FELS' 300.

Figure 11:
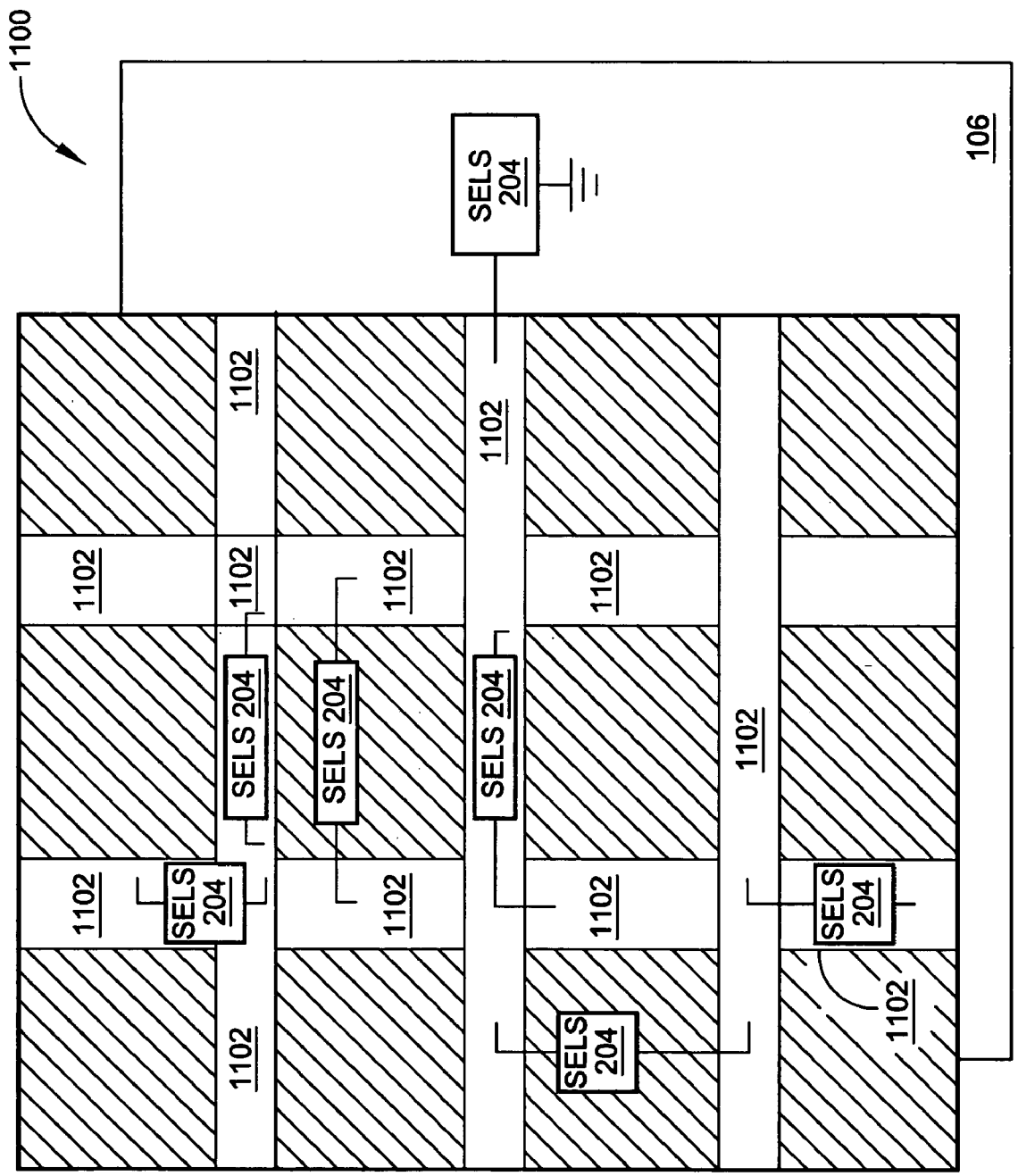
FIG. 11 is a plan view schematic diagram illustrating a bracket design where a plurality of fixed electrical length sections form a matrix of adjoining conductive areas.

FIG. 11 is a plan view schematic diagram illustrating a bracket design 1100 where a plurality of fixed electrical length sections form a matrix of adjoining conductive areas 1102. For example, the adjoining conductive areas may part of a wireless device keyboard that is mounted overlying PCB groundplane 106. The spaces, represented with cross-hatched lines, are the individual keypads. In this aspect, the adjoining conductive areas 1102 are the FELS'. The bracket 1100 also includes a plurality of selectable electrical length sections 204 that are used to couple between fixed electrical length sections 1102. A variety of connection configurations are shown, but the examples are not exhaustive of every possible combination. At least one of the selectable electrical length sections 204 is coupled to the groundplane 106. Alternately, a FELS, enabled as a screw or wire (not shown), for example, may connect the bracket 1100 to the groundplane 106.

Figure 12:
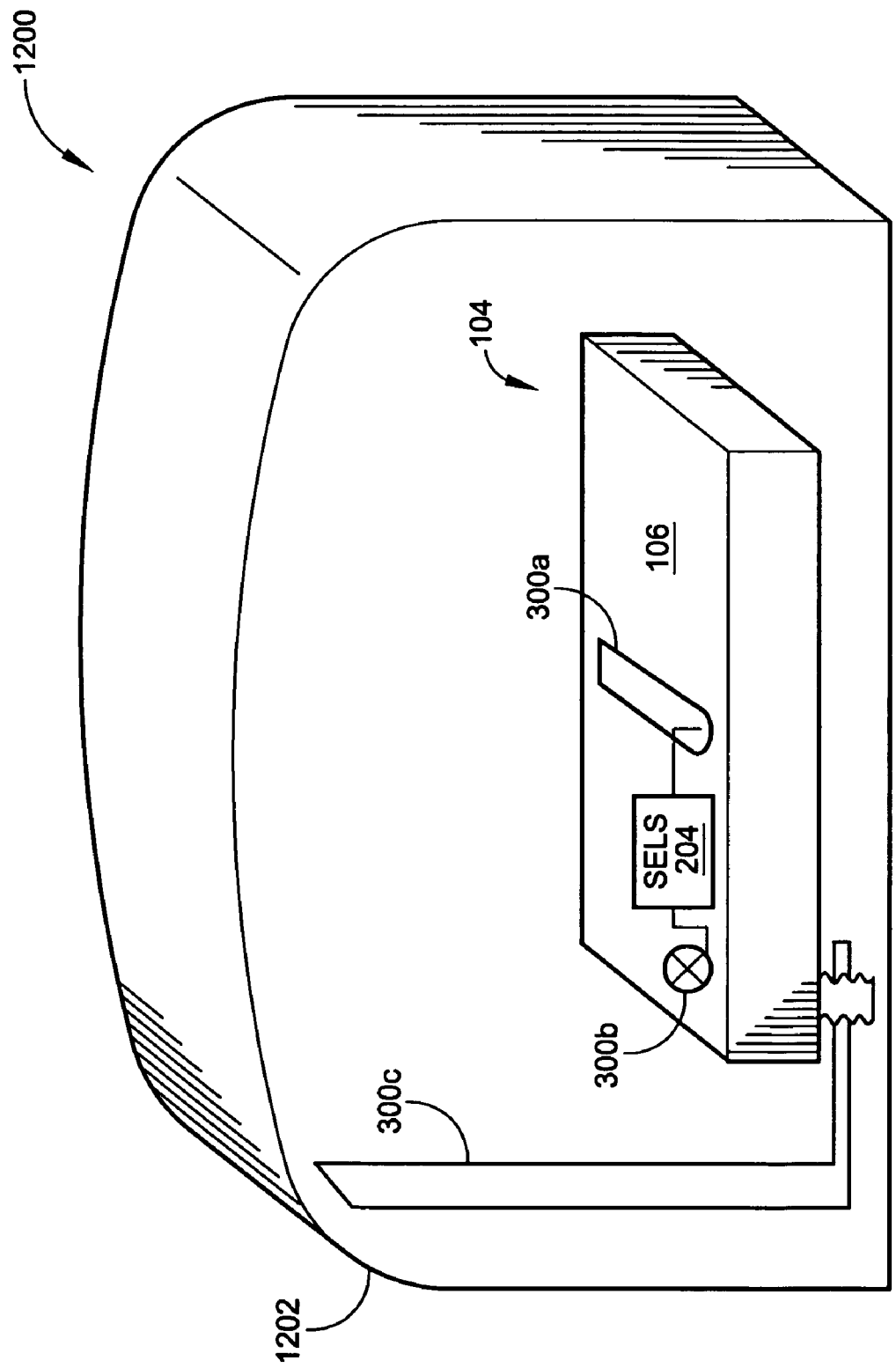
FIG. 12 is a perspective cutaway view illustrating a bracket housing design.

FIG. 12 is a perspective cutaway view illustrating a bracket housing design 1200. A housing 1202 surrounds the electrical circuit 104, and functions as a bracket element. A third fixed electrical length section 300*c* is a conductive trace (or conductive paint) formed on the housing 1200, coupled to the groundplane 106 through a SELS 204. As shown, SELS 204 is connected to a first FELS 300*a*, enabled as a conductive trace of a PCB, a second FELS 300*b*, enabled as a screw, connects FELS 300*a* to 300*c*. In other aspects, the FELS 300*b* can be a spring-loaded clip, pogo pin, or a conductive pillow (gasket). A variety of other bracket configurations are possible that make use of the housing as a bracket element, as would be understood by those skilled in the art in light of the above-mentioned examples.

Figure 18:
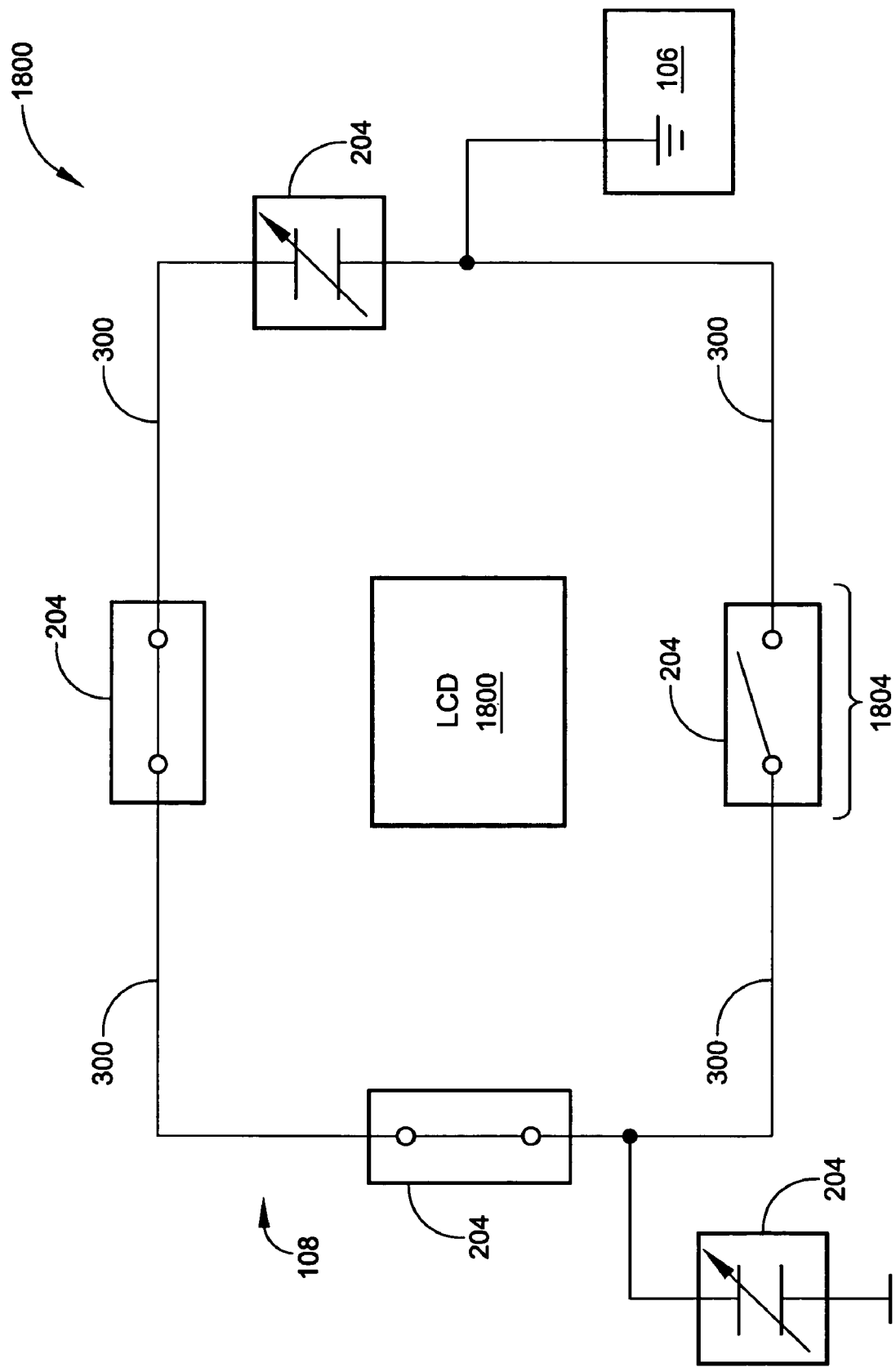
FIG. 18 is a plan view drawing of a wireless device display bracket design.

FIG. 18 is a plan view drawing of a wireless device display bracket design. In this aspect the electrical circuit is a liquid crystal display (LCD) 1800 or other type of display circuit. The bracket 108 includes a (at least one) selectable electrical length section 204 coupling between fixed electrical length sections 300. A plurality of fixed electrical length sections 300 form perimeter regions around the LCD 1800. The exact shape of the perimeter is determined by using the SELS' 204 to couple or connect FELS' 300. The perimeter need not necessarily be closed. As shown the perimeter has an opening 1804. The opening 1804 placement and electrical length may be tuned used a SELS 204 in response to changing transmission frequencies, for example. Further, the opening 1804 may be formed as a result of not switching a SELS 204. Although the perimeter regions are shown as series-connected, parallel connections are also possible using a SELS 204. Further, a SELS 204 or FELS 300 may be used to connect the bracket 108 to a groundplane, such as a proximate PCB groundplane 106.

FIG. 13 is a perspective drawing illustrating some exemplary FELS variations. The FELS 300 can be a conductive metal member that is soldered or tension mounted to a bracket or groundplane. The metal form can be straight 1300, L-shaped 1302, or O-shaped member 1304. Other shapes, or combinations of shapes are possible. Some shapes are dependent upon the surrounding area available. In addition, the FELS may be a wire 1306, a fastener, such as screw 1308, conductive pillow (gasket) 1312, or a conductive element, such as a conductive trace or paint 1310 formed on a PCB or housing. These are just a few examples of FELS elements. Any element capable of conducting an electrical current is potentially capable of acting as a FELS.

FIG. 14 is a schematic block diagram of the present invention portable wireless telephone communications device with a reconfigurable radiation desensitivity bracket. The device 1400 comprises a telephone transceiver 1402 and an antenna 1404 connected to the transceiver 1402. The portable device 1400 includes an electrical circuit 1406 having a groundplane 1408. A reconfigurable radiation desensitivity bracket 1410 is coupled to the groundplane 1408. As in the more generic wireless device described in FIG. 1, the portable device electrical circuit 1406 may be components mounted on a printed circuit board (PCB), a display, a connector, or a keypad. The details of bracket 1410 are essentially the same as the brackets described in FIGS. 1 through 13 and 18, above, and will not be repeated in the interest of brevity.

Figure 15:
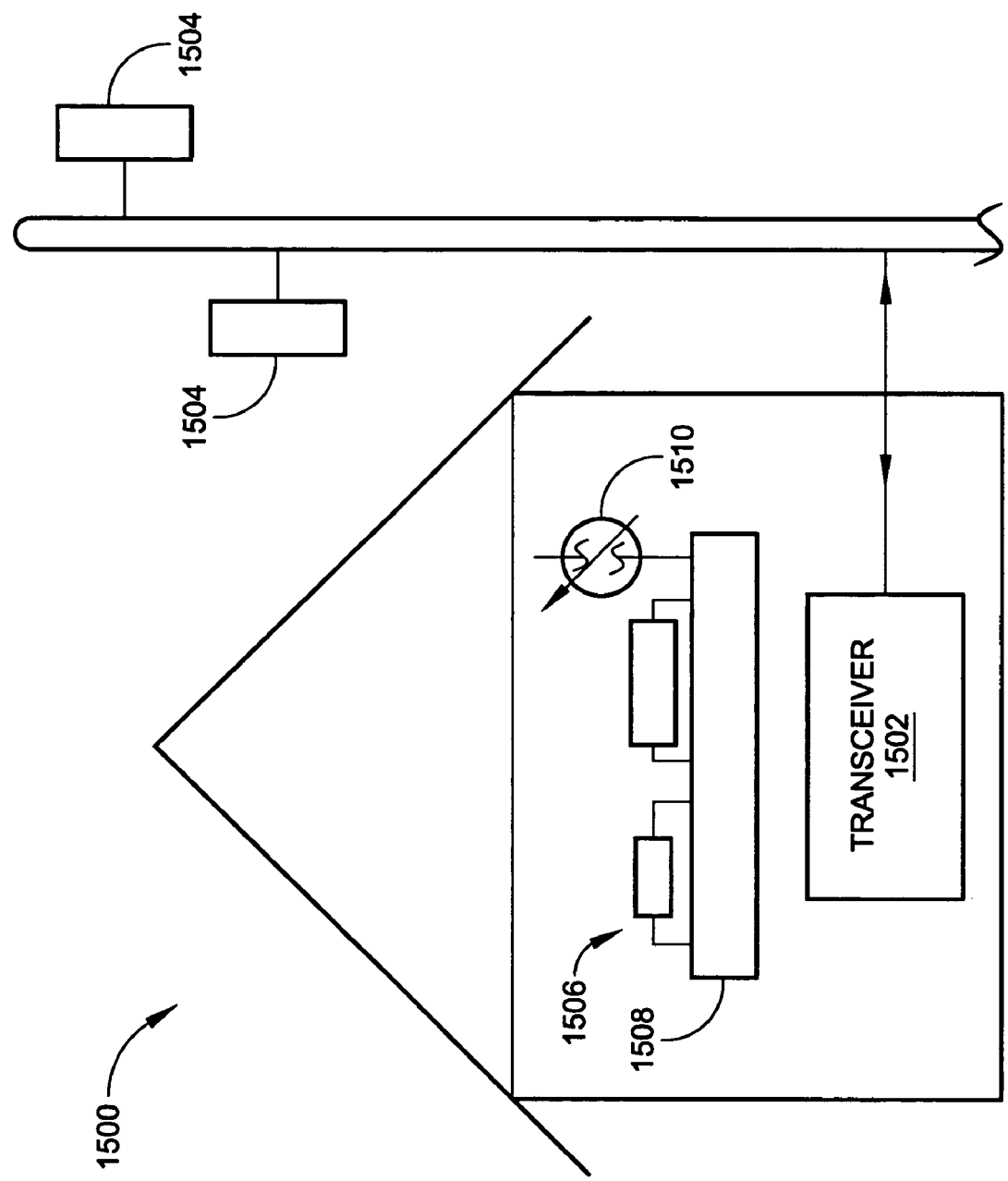
FIG. 15 is a schematic block diagram of the present invention wireless communications base station with a reconfigurable radiation desensitivity bracket.

FIG. 15 is a schematic block diagram of the present invention wireless communications base station with a reconfigurable radiation desensitivity bracket. The base station 1500 comprises a telephone transceiver 1502 and an antenna 1504 connected to the transceiver 1502. In this case, two antennas marked 1504 are shown. The base station 1500 also includes an electrical circuit 1506 having a groundplane 1508. A reconfigurable radiation desensitivity bracket 1510 is coupled to the groundplane 1508. As in the more generic wireless device described in FIG. 1, the base station electrical circuit 1506 may be components mounted on a printed circuit board (PCB), a display, a connector, or a keypad. The details of bracket 1510 are essentially the same as the brackets described in FIGS. 1 through 13 and 18, above, and will not be repeated in the interest of brevity.

Functional Description

Figure 16:
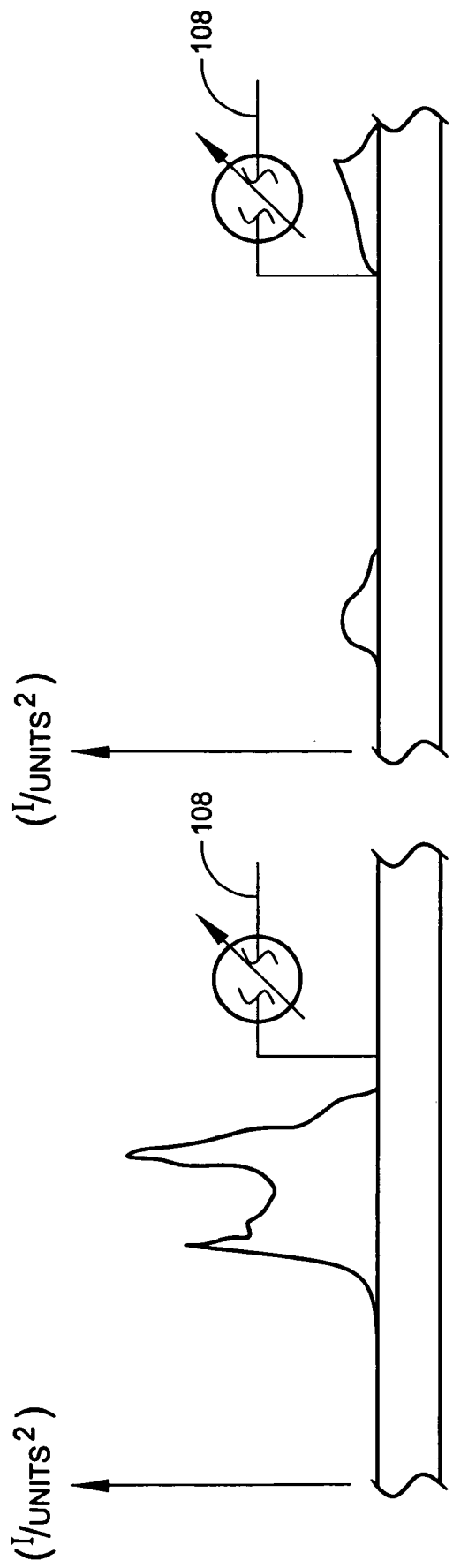
FIGS. 16A and 16B are diagrams illustrating the present invention bracket redistributing radiation-induced current flow in a groundplane.

FIGS. 16A and 16B are diagrams illustrating the present invention bracket redistributing radiation-induced current flow in a groundplane. The vertical dimension illustrates current flow (I). The current through an area (unit$^2$) is one possible measure of current distribution, for example, A/in$^2$. However, other measurements of current or current distribution can be used to illustrate the invention. In FIG. 16A, a relatively high current flow in shown in one particular region as a result of a source radiating at 890 MHz. In response to enabling the bracket 108, the current flow is redistributed, as shown in FIG. 16B. The bracket may be considered frequency reconfigurable, as a different electrical length may be used for different radiated frequencies. Alternately, the bracket may be considered space-reconfigurable, as it can be used to redistribute current flow to different regions of the groundplane. For example, the bracket 108 may be tuned to redistribute current (as shown in FIG. 16A) after device is moved near a proximate object, to create the current pattern shown in FIG. 16B.

Figure 17:
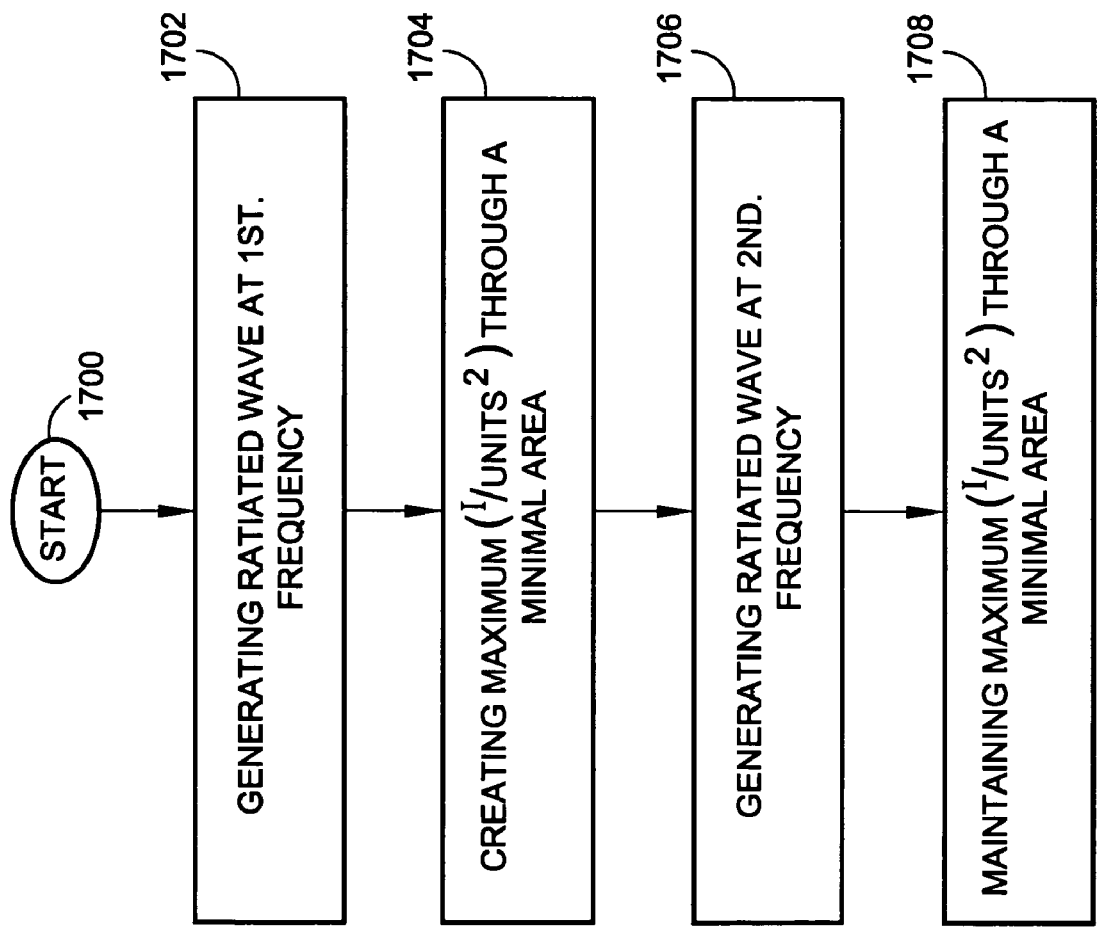
FIG. 17 is a flowchart illustrating the present invention method for reconfigurable radiation desensitivity in a wireless communications device.

FIG. 17 is a flowchart illustrating the present invention method for reconfigurable radiation desensitivity in a wireless communications device. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1700.

Step 1702 generates a radiated wave at a first frequency. Alternately stated, Step 1702 transmits at a first frequency. Step 1704 in response to generating the radiated wave at the first frequency, creates a maximum current per units square (I/units$^2$) through a minimal area of an electrical circuit groundplane. That is, current flow is induced as a result of the wave radiated in Step 1702. Step 1706 generates a radiated wave (transmits) at a second frequency. Alternately stated, the wireless device changes the frequency of transmission between Steps 1702 and 1706. Step 1708, in response to generating the radiated wave at the second frequency, maintains the maximum I/units$^2$ through the minimal area of the groundplane. Alternately stated, with respect to a groundplane area with a predetermined (minimal) size, radiation-associated current flow is not allowed to exceed a predetermined (maximum) level.

The groundplane may be associated with an electrical circuit such as components mounted on a printed circuit board (PCB), a display, a connector, or a keypad. However, the invention is not limited to any particular type of electrical circuit or groundplane. The choice of the current-related measurement is somewhat arbitrary, and the invention can also be expressed in other units of measurement related to current, energy, or field strength Typically, maintaining the maximum I/units$^2$ through the minimal area of the groundplane (Step 1708) includes coupling the groundplane to a bracket having a selectable effective electrical length. The coupling mechanism may be transistor coupling, where the transistor acts as a switch, buffer, current amplifier, voltage amplifier, or reactance element. In other aspects, the coupling mechanism is p/n junction coupling through a PIN diode, selectable capacitive coupling through a varactor diode or ferroelectric capacitor, variable gap coupling using a MEMS, or mechanically bridging through a switch or MEMS. The same analysis applies to Step 1704.

In one aspect, Step 1708 (or Step 1704) additionally couples the groundplane to a bracket with a fixed physical length section to provide a combined effective electrical length responsive to the fixed physical length and the selectable effective electrical length. Further, the groundplane may be coupled to a bracket with a plurality of selectable electrical length sections. The plurality of selectable electrical length sections may be connected in a configuration such as groundplane connected, series-connected, parallel-connected, or combinations of the above-mentioned connection configurations. The invention is not limited to any particular connection configuration type.

In another aspect, Step 1708 (Step 1704) couples the groundplane to a bracket with a plurality of fixed physical length sections. The plurality of fixed electrical length sections can be connected to a selectable electrical length section in a configuration such as connected to the groundplane, series-connected, parallel-connected, or combinations of the above-mentioned connection configurations.

A wireless communications device with a reconfigurable radiation desensitivity bracket, and corresponding reconfigurable radiation desensitivity method have been provided. Some examples of specific bracket shapes and schematic arrangements have been presented to clarify the invention. Likewise, some specific physical implementations and uses for the invention have been mentioned. However, the invention is not limited to just these examples. Other variations and embodiments of the invention will occur to those skilled in the art.

We claim:

1. A wireless communications device comprising:
   a wireless telephone transmitter configured to operate at a first frequency and a second frequency;
   an antenna connected to the transmitter;
   an electrical circuit having a groundplane; and,
   a reconfigurable radiation desensitivity bracket coupled to the groundplane and having a selectable effective electrical length responsive to control signals to have a first effective electrical length selected in response to the transmitter operating at the first frequency, and a second effective electrical length, selected in response to the transmitter operating at the second frequency.

2. The device of claim 1 wherein the electrical circuit is selected from the group including components mounted on a printed circuit board (PCB), a display, a connector, and a keypad.

3. The device of claim 1 wherein the selectable electrical length section has a distal end, a proximal end, a control input to accept the control signals.

4. The device of claim 3 wherein the bracket comprises a fixed electrical length section having a distal end, a proximal end, and a fixed physical length,
   the combination of the selectable electrical length section and the fixed electrical length section providing a combined selectable effective electrical length responsive to the control signal.

5. The device of claim 4 wherein the bracket includes a plurality of fixed electrical length sections.

6. The device of claim 5 wherein the plurality of fixed electrical length sections are connected to a selectable electrical length section in a configuration selected from the group including connected to the groundplane, series-connected, parallel-connected, and combinations of the above-mentioned connection configurations.

7. The device of claim 6 wherein the plurality of fixed electrical length sections form a matrix of adjoining conductive areas;
   wherein a plurality of selectable electrical length sections couple between fixed electrical length sections; and,
   wherein at least one of the plurality of selectable electrical length sections is coupled to the groundplane.

8. The device of claim 4 wherein the fixed electrical length section is an element selected from the group including a wire, conductive paint, conductive trace, conductive pillow, fastener, and a member formed straight, L-shaped, O-shaped, and combinations of the above-mentioned forms.

9. The device of claim 4 further comprising:
   a housing surrounding the electrical circuit; and,
   wherein the fixed electrical length section is a conductive element formed on the housing and coupled to the groundplane.

10. The device of claim 4 wherein the fixed electrical length section is a conductive trace formed on the electrical circuit.

11. The device of claim 4 wherein the electrical circuit is a liquid crystal display (LCD);
    wherein the bracket includes:
       a selectable electrical length section coupling between fixed electrical length sections; and,
       a plurality of fixed electrical length sections forming perimeter regions around the LCD.

12. The device of claim 3 wherein the bracket includes a plurality of selectable electrical length sections.

13. The device of claim 12 wherein the plurality of selectable electrical length sections are connected in a configuration selected from the group including connected to the groundplane, series-connected, parallel-connected, and combinations of the above-mentioned connection configurations.

14. The device of claim 3 wherein the selectable electrical length section is selected from the group including a FET, PIN diode, ferroelectric capacitor, varactor diode, and microelectromechanical system (MEMS) switch.

15. The device of claim 3 further comprising:
    a desensitivity control circuit having an input to accept frequency selection commands and an output connected to the selectable effective length sections, supplying control signals in response to the frequency selection commands.

16. The device of claim 1 wherein the transmitter is a wireless telephone transmitter.

17. A portable wireless telephone communications device with a reconfigurable radiation desensitivity bracket, the device comprising:
    a telephone transceiver;
    an antenna connected to the transceiver;
    an electrical circuit having a groundplane; and,
    a reconfigurable radiation desensitivity bracket coupled to the groundplane and responsive to control signals to vary current flow through the groundplane in accordance with a frequency of operation of the telephone transceiver.

18. The portable device of claim 17 wherein the electrical circuit is selected from the group including components mounted on a printed circuit board (PCB), a display, a connector, and a keypad.

19. The portable device of claim 17 wherein the bracket includes a selectable electrical length section having a distal end, a proximal end, a control input to accept control signals, and a selectable effective electrical length responsive to the control signals.

20. The portable device of claim 19 wherein the bracket further includes a fixed electrical length section having a distal end, a proximal end, and a fixed physical length; and, wherein the combination of the selectable electrical length section and the fixed electrical length section provides a combined selectable effective electrical length responsive to the control signal.

21. A wireless communications base station with a reconfigurable radiation desensitivity bracket, the base station comprising:

a base station telephone transceiver;

an antenna connected to the transceiver;

an electrical circuit having a groundplane; and, a reconfigurable radiation desensitivity bracket coupled to the groundplane and responsive to control signals to vary current flow through the groundplane in accordance with a frequency of operation of the base station telephone transceiver.

22. The base station of claim 21 wherein the bracket includes a selectable electrical length section having a distal end, a proximal end, a control input to accept control signals, and a selectable effective electrical length responsive to the control signals.

23. The base station of claim 22 wherein the bracket further includes a fixed electrical length section having a distal end, a proximal end, and a fixed physical length; and, wherein the combination of the selectable electrical length section and the fixed electrical length section provides a combined selectable effective electrical length responsive to the control signal.

24. A wireless communication device comprising:

a wireless transceiver;

an antenna connected to the transceiver and comprising a groundplane; and a reconfigurable radiation desensitivity bracket coupled to the groundplane and responsive to control signals to vary current flow through the groundplane in accordance with a frequency of operation of the wireless transceiver.

25. The wireless communication device of claim 24 wherein the bracket has a selectable effective electrical length responsive to the control signals to have a first effective electrical length in response to the transceiver operating at a first frequency and a second effective electrical length, selected in response to the transceiver operating at a second frequency.

26. A wireless communications device comprising:

a transmitter;

an antenna connected to the transmitter;

a liquid crystal display (LCD) having a groundplane; and a reconfigurable radiation bracket coupled to the groundplane and comprising:

a plurality of fixed electrical length sections forming perimeter regions around the LCD; and a selectable electrical length section having a selectable effective electrical length responsive to a control signal, a distal end, a proximal end, and a control input to accept the control signal, the combination of the selectable electrical length section and the fixed electrical length sections providing a combined selectable effective electrical length responsive to the control signals.

* * * * *